March 31, 1970 E. D. WOLLEY 3,504,242

SWITCHING POWER TRANSISTOR WITH THYRISTOR OVERLOAD CAPACITY

Filed Aug. 11, 1967

WITNESSES

Edwin E. Bassler

Lee P. Johns

INVENTOR

Elden D. Wolley

BY

C. L. Menzemer

ATTORNEY

United States Patent Office 3,504,242
Patented Mar. 31, 1970

3,504,242

SWITCHING POWER TRANSISTOR WITH THYRISTOR OVERLOAD CAPACITY

Elden D. Wolley, Monroeville, Pa., assignor to Westinghouse Electric Corporation, Pittsburgh, Pa., a corporation of Pennsylvania Filed Aug. 11, 1967, Ser. No. 660,103
Int. Cl. H01l 11/00, 7/00, 3/00
U.S. Cl. 317—235 5 Claims

ABSTRACT OF THE DISCLOSURE

A switching transistor comprising a semiconductor body with two outer surfaces; the body having five regions of alternately different type conductivity, three p-n junctions and one n+-n junction between the regions; and three electrodes, to enhance the switching capability, the "on" voltage of a conventional transistor, while having overload protection of a thyristor.

BACKGROUND OF THE INVENTION

Field of the invention

This invention relates to an improved transistor structure and, more particularly, to a four element switching device.

PNPN thyristors suitable as switching devices have been constructed and used. They are dependent upon an increase in alpha with current to determine the voltage difference between "on" and "off" states of the device. The alpha increase may be dependent upon any one of several factors.

Description of the prior art

There is a need for high power, fast switching elements in solid state power conditioning systems including, for example, inverters, converters, choppers, cycloconverters. Two classes of power semiconductors are generally used, i.e., the power transistor and the thyristor or silicon controlled rectifier. The transistor is normally used in low and medium power equipment (up to perhaps a few kilowatts) and features the control of load current by the input signal at all times. A disadvantage of the transistor is the very limited current overload capability and limited forward voltage rating (about 400 volts), and it cannot support large reverse voltages. The thyristor or SCR, is normally used in medium and high power equipment, and features pulse turn-on, that is, the input signal loses control of the load current once it has turned the device on. Control can only be regained by forcing the load current to fall to zero by external means. The thyristor has a high current overload capability and can readily be manufactured for high forward blocking voltage ratings (about 1500–2000 volts). Moreover, it can also support large reverse voltages.

Both of these power devices can be manufactured with moderately high switching speeds, and the transistor can of course be used in either a linear mode or a switching mode, but neither device is entirely satisfactory for power conditioning applications owing to the above limitations. The difficulty of compromising with these limitations increases as the devices grow larger and the demands of strategic power-conversion equipment increase. Accordingly, there is a need for a power device that combines the advantages of the transistor and the thyristor without involving the disadvantages of either.

It has been found in accordance with this invention that the foregoing difficulties may be overcome by providing a transistor having an additional region or fourth layer structure and having a shorted emitter construction which enables the attainment of large holding currents even though the alpha of the gated transistor-like section is high without sacrificing the "on voltage" of the transistor or its collector resistance particularly.

Accordingly, it is an object of this invention to provide a switching transistor having an integral overload protection as well as switching capability and "on" voltage of a transistor.

It is another object of this invention to provide a switching transistor having a low resistivity region in the active collector region.

It is another object of this invention to provide a switching transistor having the advantages of switching capability "on" voltage of the transistor as well as the overload protection of a thyristor.

Finally, it is an object of this invention to satisfy the foregoing objects and desiderata in a simple and effective manner.

SUMMARY OF THE INVENTION

Briefly, the invention is directed to a semiconductor switch device comprising a first region of a first type of conductivity, a second region of a second type of conductivity, a first p-n junction between said first and second regions, the first region including at a surface thereof, remote from said second region, a third region of said second conductivity type of a higher impurity concentration than said second region, the second region including at a surface thereof, remote from said first region, a fourth region of said second conductivity type of a higher impurity concentration than said second region, the second region including at said surface, spaced from said fourth region, a fifth region of the first conductivity type, and one of said fourth and fifth regions being in a configuration enclosing the other of said fourth and fifth regions in the plane of said surface.

BRIEF DESCRIPTION OF THE DRAWINGS

For a better understanding of the nature and objects of this invention, reference is made to the drawings, in which.

Similar numerals refer to similar parts throughout the several views of the drawings.

DESCRIPTION OF THE PREFERRED EMBODIMENTS

Figure 1:
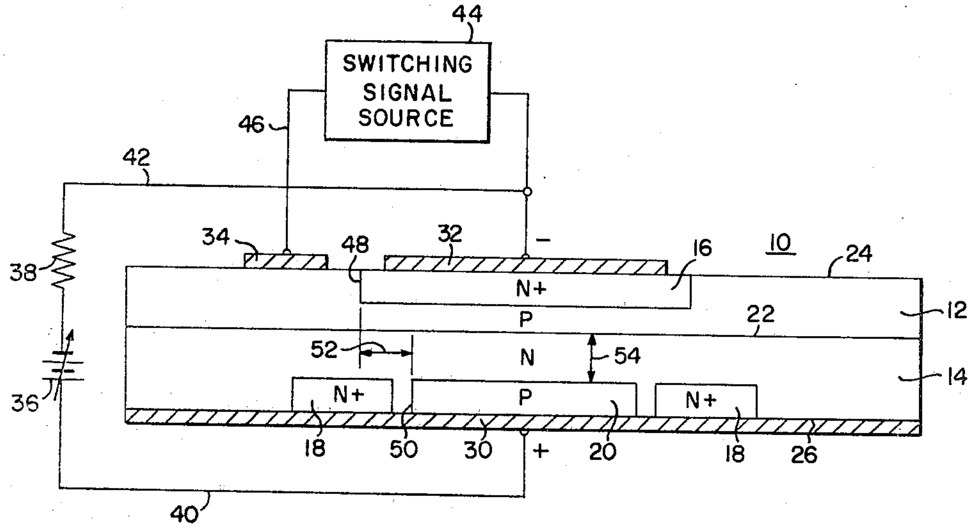
FIGURE 1 illustrates a circuit including a semiconductor switch in accordance with the invention.

A four region semiconductor switch, having three terminals, an anode terminal, a cathode terminal, and a gate terminal effectively operates as two transistors of opposite polarity. As shown in FIG. 1 a four region, three terminal device is generally indicated at 10. The device comprises a first region 12 formed of a P-type conductivity material and a second region 14 of an N-type conductivity material. The semiconductor switch 10 also includes a third region 16 of N+-type material of a higher impurity concentration than that of the second region 14. The second region 14 also includes a fourth region of N+-type material having a higher impurity concentration than that of the second region. The second region 14 also includes a fifth region 20 of P-type material.

The first and second regions 12 and 14 are zones of opposite polarity and are separated by a P-N junction 22. The third region 16 is disposed in the first region 12 at a surface 24 remote from the junction 22. Likewise, the fourth and fifth regions 18 and 20 are disposed at a surface 26 of the second region remote from the junction 22.

A device in accordance with this invention may be made by starting with a body of N-type silicon having a thickness of about 150 microns and a resistivity of about 25 ohm-centimeters. Into the first and second major surfaces of the starting material are diffused an acceptor impurity, for example boron, to provide the P-type regions 12 and 20 having a sheet resistivity of about 100 ohms per square and a surface concentration of about $2\times10^{19}$ atoms per cubic centimeter, and also having a junction depth within the starting material of about 20 microns. The remaining portion of the starting material provides N-type region 14. The third and fourth regions 16 and 18 of N-type material are formed by selective diffusion with an impurity such as phosphorus using oxide masking in a conventional manner. These N+ regions may have a sheet resistivity of about 0.1 ohm per square, a surface concentration of about $5\times10^{20}$ atoms per cubic centimeter, and having a depth of about 12 microns.

As shown in FIG. 1, the third region 16 preferably has a greater area than the fifth region 20. Moreover, the outer periphery of the third region 16 overlaps the inner edge portion of the fourth region 18. In other words, the fourth region underlies a portion of the third region. In addition, the fourth region 18 surrounds and encloses the fifth region 20. The N+ (third region) is larger than fifth region in order to allow collector current which is concentrated at the periphery of third region to flow directly to the low resistivity fourth region thereby yielding a low collector resistance.

Figure 2:
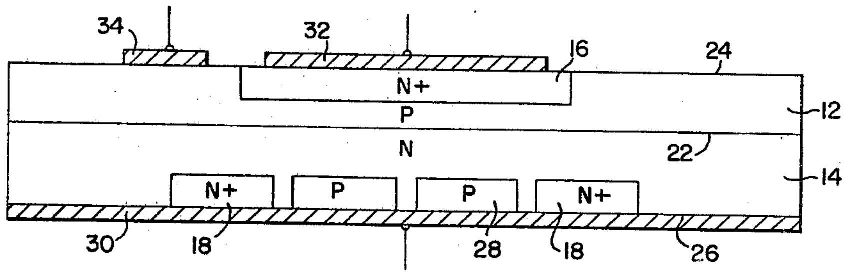
FIG. 2 illustrates a switch equivalent to that shown in FIG. 1.

In another embodiment as shown in FIG. 2, a fifth currents the P-N-P-N switch structure or thyristor made up of regions 16, 12, 14, and 20 turns on and consequently the voltage across the device remains relatively low even for large currents such as fault currents in power applications.

The current at which the thyristor structure turns on can be adjusted by adjusting the degree of "shorting" of the fifth region 20 which is accomplished by adjusting the spacing 52 between the junction terminations 48 and 50, by adjusting the thickness 54 of the N-base or second region 14 between the junctions 22 and 50, and by adjusting the diameter of the fifth region 20.

In order to maintain satisfactory turn-off characteristics in the transistor, the current at which the thyristor element turns on is made relatively large. In some cases, it may be desirable to have the fifth region or anode emitter of the thyristor shorted internally as well as externally as shown by the configuration of the fifth region 28 in FIG. 2.

With some sacrifice of the turnoff capability, it is possible to cause the holding current to fall well within the operating range of the transistor, thus yielding a lower on voltage than for a conventional transistor not fully in saturation. Such a device has better turnoff characteristics than the conventional turnoff thyristor.

A comparison of the performance of various types of switching elements which shows the trade off that is made for each type of a device is shown in the table.

TABLE.—QUALITATIVE PERFORMANCE OF VARIOUS TYPES OF POWER SWITCHING ELEMENTS

| | Conventional transistor | Conventional thyristor | GTOT wide N-base | GTOT narrow N-base | GTOT* shorted anode emitter |
|---|---|---|---|---|---|
| Low current forward drop | Excellent | Good | Poor | Fair | Excellent. |
| Operating current forward drop | Good | do | do | do | Good. |
| Surge capability | Very poor | do | Good | Good | Do. |
| Reverse blocking | None | do | do | do | None. |
| Turn-off | Good | Poor | do | Fair | Good. |

*Or switching transistor with integral surge protection.
GTOT means gate turnoff thyristor.

region 28 may be a region having a central opening as distinguished from the region 20 of FIG. 1 having no opening. In other respects, the device of FIG. 2 is similar to that of FIG. 1.

In addition to the several regions 16, 18, and 20 the semiconductor switch 10 includes three terminals including an anode terminal 30, a cathode terminal 32, and a gate terminal 34. The terminal 30 extends over the junction 50, producing a short. The NPNP structure consisting of regions 16, 12, 14, and 20, respectively, will switch to a low voltage "on" state even though the junction 50 is shorted by the contact 30. The switching current is a function of the average resistivity of the regions 14 and 12 enclosed by the fifth and third regions respectively, of the dimensions of the third and fifth regions, and of the lifetime and doping profile near the junctions 48 and 50. This switching current can be adjusted by control of such parameters to be within or just slightly greater than the normal current rating of the transistor thus providing the transistor with a surge current protection not obtained in conventional transistors. Conventional transistors may come out of saturation during surge and a combination of high collector voltage and high current destroy the device.

The semiconductor switch 10 is included in a circuit including a battery 36, a load resistor 38, and interconnecting lead wires 40 and 42 leading to the terminals 30 and 32. The circuit also includes a switching signal source 44 which is connected to the gate terminal 34 by a lead wire 46. The embodiment of the switch shown in FIG. 2 may be disposed in a similar circuit.

Under normal operating conditions, transistor action takes place at the edge 48 of the first region 16 as well as at the edge 50 of the fifth region 20. At higher load The switch of this invention is that indicated by "GTOT shorted Anode Emitter" and performs the same as a conventional transistor except that it has surge capability where the conventional transistor does not.

Accordingly, the device of the present invention satisfies a need for high power, fast switching elements in the power conditioning field and provides a transistor with the overload capability of a thyristor.

It is understood that the above specification and drawings are merely exemplary and not in limitation of the invention.

What is claimed is:

1. A semiconductor switching device for transistor operation with thyristor overload capacity comprising: a semiconductor body having first, second, third and fourth successively adjacent regions of alternate conductivity type with a PN junction between each adjacent pair of regions; first and second ohmic contacts each only on said first and second regions, respectively, on a first surface of said body; a third ohmic contact on both said third and fourth regions and shorting said PN junction therebetween on a second surface of said body opposing said first surface; said PN junction between said first and second regions having a termination at said first surface not directly opposite said fourth region on said second surface, said third region includes a portion adjacent said third ohmic contact and remote from said PN junction with said second region that is of substantially higher impurity concentration than the bulk of said third region, said portion of higher impurity concentration being directly opposite said termination of said PN junction between said first and second regions.

2. The subject matter of claim 1 wherein: said portion of higher impurity concentration surrounds said fourth region.

3. The subject matter of claim 2 wherein: said PN junction between said third and fourth regions has a termination at said second surface in a configuration of a single closed figure.

4. The subject matter of claim 2 wherein: said PN junction between said third and fourth regions has a termination at said second surface of inner and outer closed figures.

5. The subject matter of claim 1 wherein: said semiconductor body has PN junctions consisting only of those between first and second, second and third, and third and fourth regions.

References Cited

UNITED STATES PATENTS

| | | | |
|---|---|---|---|
| 2,993,154 | 7/1961 | Goldey et al. | 317—235 |
| 3,337,783 | 8/1967 | Stehney | 317—235 |
| 3,360,696 | 12/1967 | Neilson et al. | 317—235 |

FOREIGN PATENTS

| | | |
|---|---|---|
| 945,249 | 12/1963 | Great Britain. |

JOHN W. HUCKERT, Primary Examiner

B. ESTRIN, Assistant Examiner

U.S. Cl. X.R.

317—234